(12) United States Patent
Fukuma et al.

(10) Patent No.: US 9,535,088 B2
(45) Date of Patent: Jan. 3, 2017

(54) SIGNAL DETECTION CIRCUIT AND SCANNING PROBE MICROSCOPE

(71) Applicant: NATIONAL UNIVERSITY CORPORATION KANAZAWA UNIVERSITY, Ishikawa (JP)

(72) Inventors: Takeshi Fukuma, Ishikawa (JP); Kazuki Miyata, Ishikawa (JP)

(73) Assignee: NATIONAL UNIVERSITY CORPORATION KANAZAWA UNIVERSITY, Ishikawa (JP)

( * ) Notice: Subject to any disclaimer, the term of this patent is extended or adjusted under 35 U.S.C. 154(b) by 0 days.

(21) Appl. No.: 14/779,622

(22) PCT Filed: Mar. 4, 2014

(86) PCT No.: PCT/JP2014/001198
§ 371 (c)(1),
(2) Date: Sep. 24, 2015

(87) PCT Pub. No.: WO2014/155983
PCT Pub. Date: Oct. 2, 2014

(65) Prior Publication Data
US 2016/0047841 A1 Feb. 18, 2016

(30) Foreign Application Priority Data

Mar. 28, 2013 (JP) ................................ 2013-070575

(51) Int. Cl.
*G01Q 60/32* (2010.01)
*G01Q 20/00* (2010.01)
(Continued)

(52) U.S. Cl.
CPC .............. *G01Q 20/00* (2013.01); *G01Q 60/32* (2013.01); *H03D 3/007* (2013.01); *H03D 7/165* (2013.01); *G01Q 10/065* (2013.01)

(58) Field of Classification Search
USPC ............................................................ 850/5
See application file for complete search history.

(56) References Cited

U.S. PATENT DOCUMENTS 7,480,343 B2 * 1/2009 Eikenbroek ............ H03D 7/165
375/295
7,843,627 B2 11/2010 Abramovitch
(Continued)

FOREIGN PATENT DOCUMENTS

EP 2 325 657 5/2011
JP 2010-512518 4/2010
(Continued)

OTHER PUBLICATIONS

International Search Report issued Apr. 8, 2014 in International Application No. PCT/JP2014/001198.
(Continued)

*Primary Examiner* — Phillip A Johnston
(74) *Attorney, Agent, or Firm* — Wenderoth, Lind & Ponack, L.L.P.

(57) ABSTRACT

A signal detection circuit includes: a VCO that generates a reference signal; a complex signal generation circuit that generates a complex signal from an input signal and the reference signal; a vector operation circuit that calculates an argument of the complex signal by performing a vector operation; and a subtracting phase comparator that compares the argument with a phase of the reference signal by calculating a difference between the argument and the phase of the reference signal, wherein the complex signal generation circuit includes: a multiplication circuit that multiplies the input signal by the reference signal; and an HPF that removes a DC component from a signal output from the multiplication circuit.

8 Claims, 9 Drawing Sheets

(51) Int. Cl.
    *H03D 3/00*     (2006.01)
    *H03D 7/16*     (2006.01)
    *G01Q 10/06*     (2010.01)

(56) References Cited

U.S. PATENT DOCUMENTS

| | | |
|---|---|---|
| 8,245,316 B2 | 8/2012 | Rychen |
| 8,387,159 B2 * | 2/2013 | Fukuma ................ B82Y 35/00 850/1 |
| 2008/0295583 A1 | 12/2008 | Giessibl |
| 2010/0031404 A1 | 2/2010 | Rychen |
| 2012/0151637 A1 | 6/2012 | Fukuma et al. |

FOREIGN PATENT DOCUMENTS

| | | |
|---|---|---|
| WO | 2008/071013 | 6/2008 |
| WO | 2010/023811 | 3/2010 |

OTHER PUBLICATIONS

Extended European Search Report issued Oct. 25, 2016 in European patent application No. 14774604.4.

Kazuki Miyata et al "Real-time atomic-resolution imaging of crystal growth process in water by phase modulation atomic force microscopy at one frame per second", Applied Physics Letters, vol. 103, No. 20, Nov. 11, 2013 (Nov. 11, 2013), p. 203104, XP055094896, ISSN: 0003-6951, DOI: 10.1063/1.4830048.

* cited by examiner

SIGNAL DETECTION CIRCUIT AND SCANNING PROBE MICROSCOPE

BACKGROUND OF THE INVENTION

1. Technical Field

The present invention relates to a signal detection circuit that detects a signal according to an amplitude, a phase, and a frequency of an oscillation, and particularly, to a technique for detecting a signal according to an amplitude, a phase, and a frequency of an oscillation of a probe.

2. Description of the Related Art

Scanning probe microscopes or SPMs are microscopes that detect an interaction (for example, a tunnel current or a force of interaction) between a probe and a sample by bringing the probe closer to the sample to obtain information distribution, for example, on roughness on the surface of the sample and the electric potential distribution.

Atomic force microscopes or AFMs that are one kind of the SPMs are known. The AFMs detect a force of interaction between a probe and a sample to obtain a topographic image on the surface of the sample. More specifically, the AFMs perform feedback control on a distance between a probe and a sample to maintain a constant force of interaction between the probe and the sample. The AFMs include a cantilever with a sharp probe at its end as a force detector. By bringing the probe closer to the sample, the cantilever is displaced by the force of interaction between the probe and the sample. The force of interaction is detected using the amount of displacement. This type of AFMs is called contact mode AFMs or static mode AFMs.

On the other hand, AFMs in which a cantilever is mechanically excited at a frequency closer to the resonance frequency are called dynamic mode AFMs. The dynamic mode AFMs detect a force of interaction between a probe and a sample from change in amplitude, phase, or frequency of an oscillation that is caused by the force of interaction. The AFMs that detect a force of interaction using the amplitude, phase, and frequency are called an amplitude modulation AFM (AM-AFM), a phase modulation AFM (PM-AFM), and a frequency modulation AFM (FM-AFM), respectively.

The AFMs include, an amplitude/phase/frequency detection circuit (signal detection circuit) for detecting an amplitude, a phase, and a frequency. Conventional signal detection circuits include (i) a multiplying phase comparator including a low-pass filter (LPF) and (ii) a subtracting phase comparator including a delay circuit and a π/2 phase-shift circuit (see International Publication WO2010/023811).

SUMMARY OF THE INVENTION

1. Technical Problem

The signal detection circuit including the multiplying phase comparator performs signal processing of multiplying an input signal by a reference signal and removing harmonic components from the generated signal. Since the multiplying phase comparator includes an LPF at a lower cut-off frequency for removing high frequency components, a problem that an output signal corresponding to the input signal is delayed in the signal detection circuit including such a multiplying phase comparator occurs.

Furthermore, in the signal detection circuit including the subtracting phase comparator, for example, a π/2 phase-shift circuit such as a Hilbert conversion circuit performs signal processing of lagging the phase of the input signal by 90°. Here, the π/2 phase-shift circuit has a problem in operating only in response to a signal within a predetermined frequency range. Furthermore, the π/2 phase-shift circuit has another problem in that an output signal corresponding to the input signal is delayed when a high-order circuit for expanding the frequency range is used. Furthermore, when the input signal contains high frequency noise, the high frequency noise cannot be removed unlike by the LPF. Thus, there is a problem that the output signal is instable due to the influence of the high frequency noise.

In order to solve the problems, the present invention provides a signal detection circuit and an SPM that can obtain a stable output signal at faster speed.

2. Solution to the Problem

In order to solve the problems, a signal detection circuit according to the present invention detects at least one of an amplitude, a phase, and a frequency signal based on an input signal and a reference signal, and includes: a first oscillation circuit that generates the reference signal; a complex signal generation circuit that generates a complex signal from the input signal and the reference signal; a vector operation circuit that calculates an argument of the complex signal by performing a vector operation; and a subtracting phase comparator that compares the argument with a phase of the reference signal by calculating a difference between the argument and the phase of the reference signal, wherein the complex signal generation circuit includes: a multiplication circuit that multiplies the input signal by the reference signal; and a high-pass filter (HPF) that removes a DC component from a signal output from the multiplication circuit.

The signal detection circuit with this configuration can generate second harmonic and perform complex signaling for analyzing signals simultaneously, by multiplying an input signal by a sine function and a cosine function that are at the same frequency as that of the input signal and removing the DC component through an HPF.

Furthermore, the signal detection circuit can detect a phase at faster speed by comparing a phase calculated by performing a vector operation and the phase of the excitation signal (reference signal) by calculating a difference between them.

Furthermore, the subtracting phase comparator may output at least a phase difference signal.

The signal detection circuit with this configuration can detect an amplitude or a phase difference signal of an oscillation at faster speed.

Furthermore, the signal detection circuit may further include a loop filter that forms a phase locked loop circuit with the first oscillation circuit and the subtracting phase comparator, wherein the phase locked loop circuit may control the first oscillation circuit so that the difference between the argument and the phase of the reference signal equals a predetermined phase offset, and generate a frequency signal corresponding to variation in frequency of the input signal through a phase locked loop, and the signal detection circuit may output the frequency signal.

The signal detection circuit with this configuration can detect a frequency signal at faster speed. Furthermore, the signal detection circuit can input a frequency signal to the first oscillation circuit, and perform the feedback control on the reference signal, thus, stably detecting a signal.

Furthermore, the vector operation circuit may calculate an absolute value of the complex signal as an amplitude signal of the input signal, and the signal detection circuit may output the amplitude signal.

The signal detection circuit with this configuration can detect an amplitude of an oscillation at faster speed.

Furthermore, the signal detection circuit may include a multiplier that matches a frequency of the reference signal generated by the first oscillation circuit with a frequency of the argument output from the vector operation circuit.

Furthermore, the signal detection circuit may include a second oscillation circuit different from the first oscillation circuit, wherein the first oscillation circuit may output, to the subtracting phase comparator, a reference signal having a frequency identical to a frequency of the argument output from the vector operation circuit, and the second oscillation circuit may output, to a multiplier, a reference signal having a frequency almost identical to a frequency of the input signal.

With the configuration, the implementations of the signal detection circuit can be more flexible.

Furthermore, in order to solve the problems, a scanning probe microscope according to the present invention includes: the signal detection circuit having the features above; a probe that detects information on a surface of a sample; an exciter that excites the probe; a sensor that detects a displacement signal of the probe; and a feedback circuit that performs feedback control for maintaining a constant interaction between the probe and the sample, wherein the signal detection circuit: determines the displacement signal detected by the sensor as the input signal; and generates an excitation signal for exciting the probe, based on the reference signal, and outputs the excitation signal to the exciter, and the feedback circuit performs the feedback control based on an output signal from the signal detection circuit.

The scanning probe microscope with this configuration can generate second harmonic and perform complex signaling for analyzing signals simultaneously, by multiplying an input signal by a sine function and a cosine function that are at the same frequency as that of the input signal and removing the DC component through an HPF.

Furthermore, the scanning probe microscope can detect a phase at faster speed by comparing a phase calculated by performing a vector operation and the phase of the excitation signal (reference signal) by calculating a difference between them.

3. Advantageous Effects of the Invention

The present invention provides a signal detection circuit and an SPM that can obtain a stable output signal at faster speed.

DETAILED DESCRIPTION OF THE INVENTION

Figure 1:
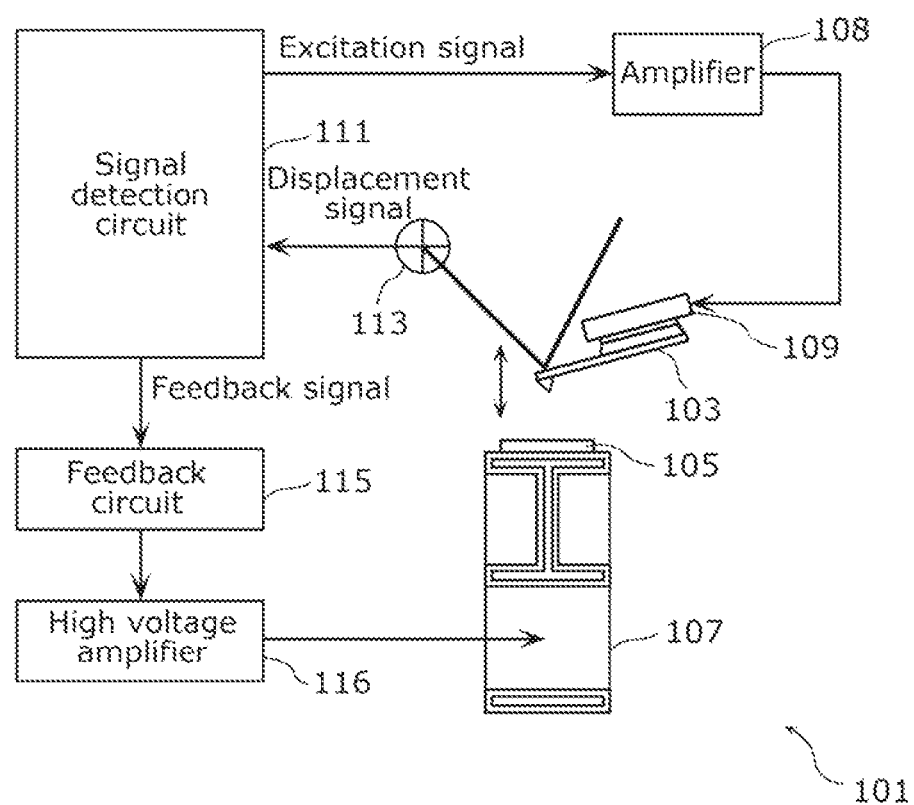
FIG. 1 schematically illustrates a configuration of a dynamic mode AFM.

Embodiments will be described in detail with reference to the drawings. The same reference numerals are assigned to the same constituent elements, and the description thereof may be omitted. Furthermore, the constituent elements in the drawings are mainly and schematically illustrated to facilitate better understanding of a person skilled in the art.

Embodiments to be described below are all the specific examples of the present invention. The values, shapes, constituent elements, and positions and connections of the constituent elements, etc. indicated in Embodiments are examples, and do not limit the present invention. The constituent elements in Embodiments that are not described in independent claims that describe the most generic concept of the present invention are described as arbitrary constituent elements.

(Underlying Knowledge Forming Basis of the Present Invention)

Before describing Embodiments according to the present invention, underlying knowledge forming the basis of the present invention will be described.

FIG. 1 schematically illustrates a configuration of a dynamic mode AFM. As illustrated in FIG. 1, an AFM 101 includes a cantilever 103, a sample stage 105, a scanner 107, an amplifier 108, an exciter 109, a signal detection circuit 111, a sensor 113, a feedback circuit 115, and a high voltage amplifier 116.

The cantilever 103 has a cantilever structure and is fabricated from, for example, silicon. It has a tip joined to the silicon tip body, and a sharp probe at the other end (not illustrated). The probe of the cantilever 103 abuts the surface of the sample for measurement that is disposed on the sample stage 105, or is disposed with a predetermined space from the surface to detect information (displacement signal) of the surface including roughness of the surface.

The scanner 107 includes, for example, a piezo actuator and moves a sample on the sample stage 105 in an X direction, a Y direction, and a Z direction to scan the sample and the cantilever 103 relative to each other.

The exciter 109 includes, for example, a piezo actuator. The signal detection circuit 111 applies an excitation signal to the exciter 109 via the amplifier 108. Accordingly, the exciter 109 excites the cantilever 103 at a predetermined frequency.

The sensor 113 includes, for example, a photo diode, and detects displacement of the cantilever 103 from the light emitted to a part of the cantilever 103 and reflected from the part. The sensor 113 outputs the detected displacement signal to the signal detection circuit 111.

The signal detection circuit 111 includes, for example, a digital circuit such as a digital lock-in amplifier. The signal detection circuit 111 detects change in at least any of the amplitude, phase, and frequency as an amount of interaction between the probe and the sample, from the displacement signal output from the sensor 113. The signal detection circuit 111 outputs the signal corresponding to the change in at least the amplitude, phase, and frequency, as a feedback signal to the feedback circuit 115. Furthermore, the feedback signal output from the feedback circuit 115 is output to the scanner 107 via the high voltage amplifier 116 to control the vertical position of the scanner 107. As such, a feedback loop for maintaining a constant distance between the probe and the sample is composed.

The signal detection circuit 111 may have, not limited to a function of detecting a signal corresponding to change in at least any of an amplitude, phase, and frequency, but an excitation control function of controlling excitation of the cantilever 103.

Here, there are several methods for implementing the signal detection circuit 111. The signal detection circuit 111 can be classified into, for example, analog type and digital type. The digital type is now mainly used because the specifications of the digital type can be flexibly changed and complicated signal processing can be performed by the digital type.

Figure 2:
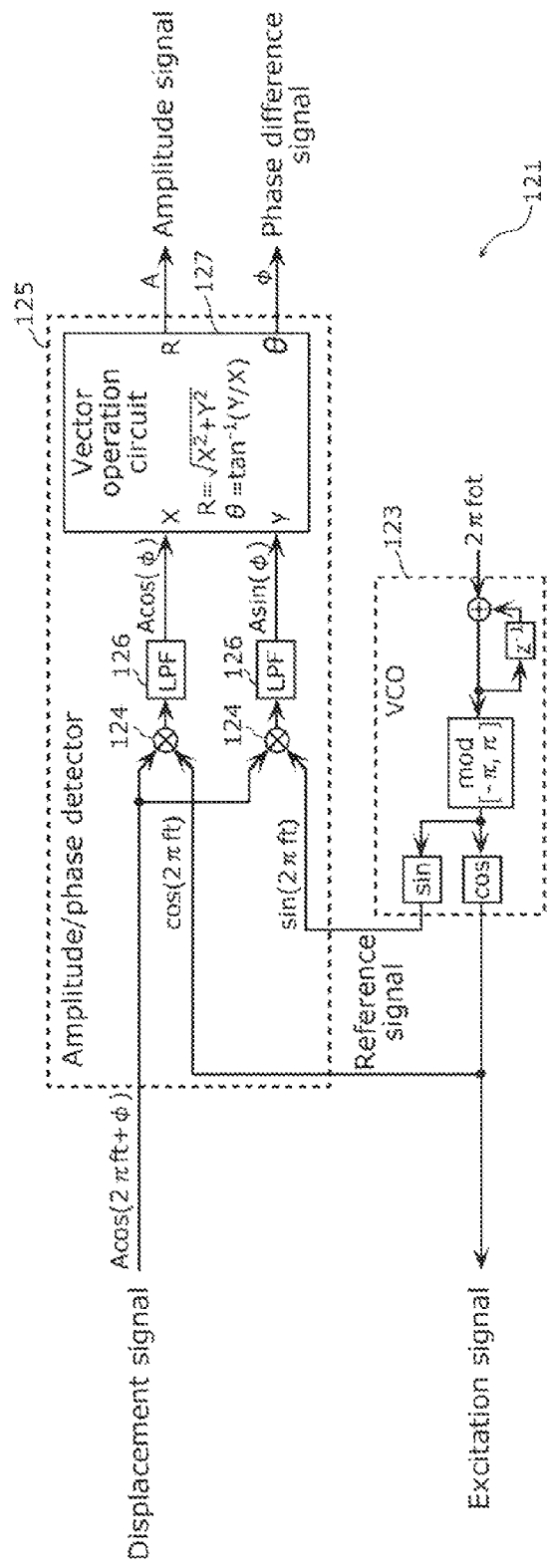
FIG. 2 schematically illustrates a configuration of a signal detection circuit for AM-AFM and PM-AFM that includes a conventional multiplying phase comparator.

FIG. 2 schematically illustrates a configuration of a signal detection circuit for AM-AFM and PM-AFM that includes a conventional multiplying phase comparator. The configuration of an amplitude/phase detector in FIG. 2 supports AM-AFMs and PM-AFMs, generates an excitation signal, and detects an amplitude signal and a phase difference signal. The amplitude signal is a signal corresponding to the amplitude of an oscillation of the cantilever, whereas the phase difference signal is a signal corresponding to a difference in phase between the excitation signal and the displacement signal of the cantilever.

As illustrated in FIG. 2, the signal detection circuit 121 includes a voltage-controlled oscillator (VCO) 123 and an amplitude/phase detector 125.

The VCO 123 generates an excitation signal cos ($2\pi ft$) that varies at an excitation frequency f. This signal is output as an excitation signal of the cantilever 103, and is used as reference signals of the amplitude/phase detector 125 that is a digital circuit.

The amplitude/phase detector 125 is, for example, a two-phase digital lock-in amplifier. A displacement signal A cos ($2\pi ft+\phi$) from the cantilever 103 is input to the amplitude/phase detector 125. This displacement signal A cos ($2\pi ft+\phi$) corresponds to an input signal according to the present invention. Furthermore, a reference signal cos ($2\pi ft$) and a reference signal sin ($2\pi ft$) that are output from the VCO 123 are input to the amplitude/phase detector 125. These reference signals cos ($2\pi ft$) and sin ($2\pi ft$) are converted into X=A cos($\phi$) and Y=A sin($\phi$), respectively, through each multiplication circuit 124 and each low-pass filter (LPF) 126. The multiplication circuit 124 multiplies each of the signals X and Y by the input displacement signal (input signal) A cos ($2\pi ft+\phi$). The resulting displacement signals are output to the respective LPFs 126. Then, the LPFs 126 remove high frequency components from the displacement signals, and output the resulting signals to a vector operation circuit 127.

The vector operation circuit 127 calculates an absolute value R and an argument $\theta$ of a complex input X+jY. The absolute value R is $(X^2+Y^2)^{1/2}$, and the argument $\theta$ is $\tan^{-1}(Y/X)$. The absolute value R corresponds to the amplitude A of the displacement signal. The argument $\theta$ corresponds to the phase difference $\phi$ between the displacement signal and the excitation signal. Thus, the absolute value R and the argument $\theta$ are output as the amplitude signal A and the phase difference signal $\phi$, respectively.

In the signal detection circuit 121 in FIG. 2, the amplitude signal A is output as a feedback signal and used for feedback control in the AM-AFM mode. The feedback control is performed such that the amplitude signal A equals a target amplitude.

In the signal detection circuit 121, the phase difference signal $\phi$ is output as a feedback signal and used for feedback control in the PM-AFM mode. The feedback control is performed such that the phase difference signal $\phi$ equals a target phase difference.

Figure 3:
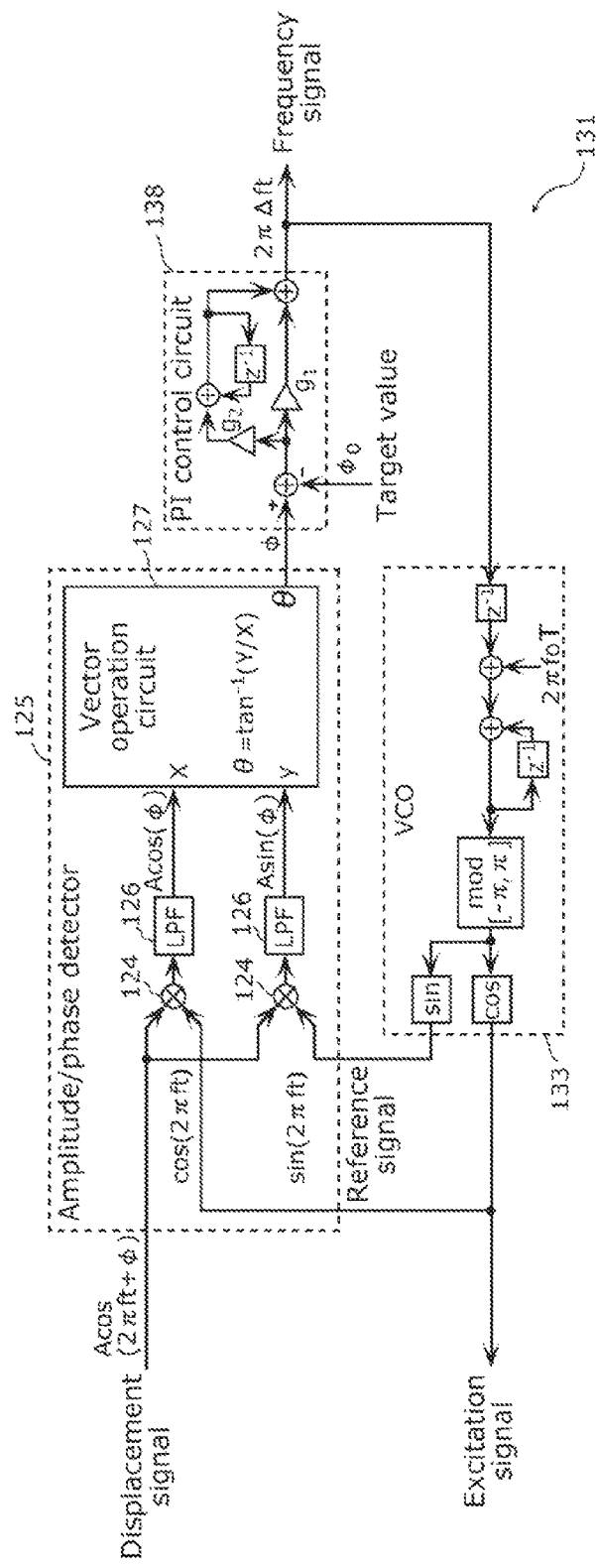
FIG. 3 schematically illustrates a configuration of a signal detection circuit for FM-AFM that includes a conventional multiplying phase comparator.

FIG. 3 schematically illustrates a configuration of a signal detection circuit for FM-AFM that includes a conventional multiplying phase comparator.

A signal detection circuit 131 in FIG. 3 supports the FM-AFM mode, generates an excitation signal, and detects a frequency signal. The frequency signal indicates a variation in the resonant frequency of the cantilever 103 that is caused by the interaction between the cantilever 103 and a sample as described above.

As illustrated in FIG. 3, the signal detection circuit 131 includes a VCO 133, an amplitude/phase detector 125 (a two-phase digital lock-in amplifier), and a proportional integral (PI) control circuit 138. The configuration of the amplitude/phase detector 125 is the same as that of the amplitude/phase detector 125 in FIG. 2. Thus, the detailed explanation will be omitted.

The VCO 133 generates an excitation signal cos ($2\pi ft$) that varies at an excitation frequency f. The excitation signal cos ($2\pi ft$) output from the VCO 133 is used as an excitation signal of the cantilever 103, and input to the amplitude/phase detector 125 as a reference signal. Furthermore, a displacement signal A cos ($2\pi ft+\phi$) from the cantilever 103 is input to the amplitude/phase detector 125. The amplitude/phase detector 125 outputs a phase difference $\phi$ between the displacement signal and the excitation signal. Here, the amplitude/phase detector 125 functions as a multiplying phase comparator, and compares phases of the displacement signal and the reference signal by multiplying the displacement signal by the reference signal.

The phase difference $\phi$ detected by the amplitude/phase detector 125 is output to the PI control circuit 138. The PI control circuit 138 controls an output $2\pi\Delta ft$ (t denotes a sampling period for input and output signals) such that the input phase difference $\phi$ equals a target value $\phi 0$. The output $2\pi\Delta ft$ is input to the VCO 133 to vary the frequency f of an output signal (excitation signal) cos ($2\pi ft$) of the VCO 133. The frequency f deviates from the free-running frequency f0 (an oscillation frequency obtained when the input is 0) of the VCO 133 by $\Delta f$.

In the configuration of FIG. 3, the VCO 133, the amplitude/phase detector 125, and the PI control circuit 138 form a phase locked loop (PLL) circuit. The PI control circuit 138 functions as a loop filter for the PLL circuit. The PLL circuit varies the value of the frequency f of the excitation signal so that the frequency of the displacement signal equals that of the excitation signal, that is, f=f0+$\Delta$f. Thus, an output value from the PI control circuit 138 is proportional to variation in the frequency of the displacement signal. Thus, the output value from the PI control circuit 138 is output as a frequency signal.

Furthermore, the PI control circuit 138 can adjust a difference in phase between the displacement signal and the excitation signal by varying the target value $\phi 0$. In the FM-AFM, the target phase difference is set to 90°. Thus, the phase difference $\phi$ is kept at 90°, and the cantilever 103 is oscillated at the resonant frequency. Even if the resonant frequency of the cantilever 103 varies by the interaction between the cantilever 103 and the sample, the cantilever 103 continues to be oscillated at the resonant frequency. The frequency signal has a value indicating variation (shift) $\Delta f$ in the resonant frequency of the cantilever 103. The frequency signal is used for feedback control.

In the signal detection circuit 121 illustrated in FIG. 2, the amplitude/phase detector 125 functions as a multiplying phase comparator and internally compares the excitation signal with the displacement signal by multiplication. This leads to generation of an unwanted harmonic component. Specifically, an output from each of the multiplication circuits 124 in the amplitude/phase detector 125 contains a component of a difference in frequency between input signals and a component of a sum of the frequencies of the input signals. The component of the sum corresponds to the unwanted harmonic component. This harmonic component is removed by the LPFs 126 arranged after the multiplication circuits 124. However, the signal detection circuit 121 including the multiplying phase comparator has a problem in that the output signal is greatly delayed from the input signal because of the use of the LPFs 126 at a lower cut-off frequency for removing high frequency components.

Furthermore, the amplitude/phase detector 125 in the circuit structure for FM-AFM in FIG. 3 functions as a multiplying phase comparator and generates an unwanted harmonic component as in the circuit of FIG. 2. In particular, in the FM-AFM, the harmonic component not only limits the feedback gain but also works against the PLL circuit. In the FM-AFM configuration shown in FIG. 3, the amplitude/phase detector 125 is a part of the PLL circuit. Thus, the amplitude/phase detector 125 generates the unwanted harmonic component in the loop in the PLL circuit. Thus, this harmonic component needs to be completely removed by the LPFs arranged after the amplitude/phase detector 125. However, the LPFs are present in the loop in the PLL circuit, and cannot be designed independently of response characteristics of the PLL circuit as a restriction. Thus, removal of the harmonic component in the FM-AFM is more difficult than in the AM-AFM and the PM-AFM. For example, using a high-order LPF for fully removing the harmonic component increases the delay. Thus, it is necessary to keep the gain of the loop filter smaller for the stability in the PLL circuit. Thus, the frequency cannot be detected stably at fast speed in the conventional PLL.

Thus, there are problems that the delay in the LPF in the FM-AFM limits not only the feedback gain of the AFM overall but also the gain of the PLL circuit.

Figure 4:
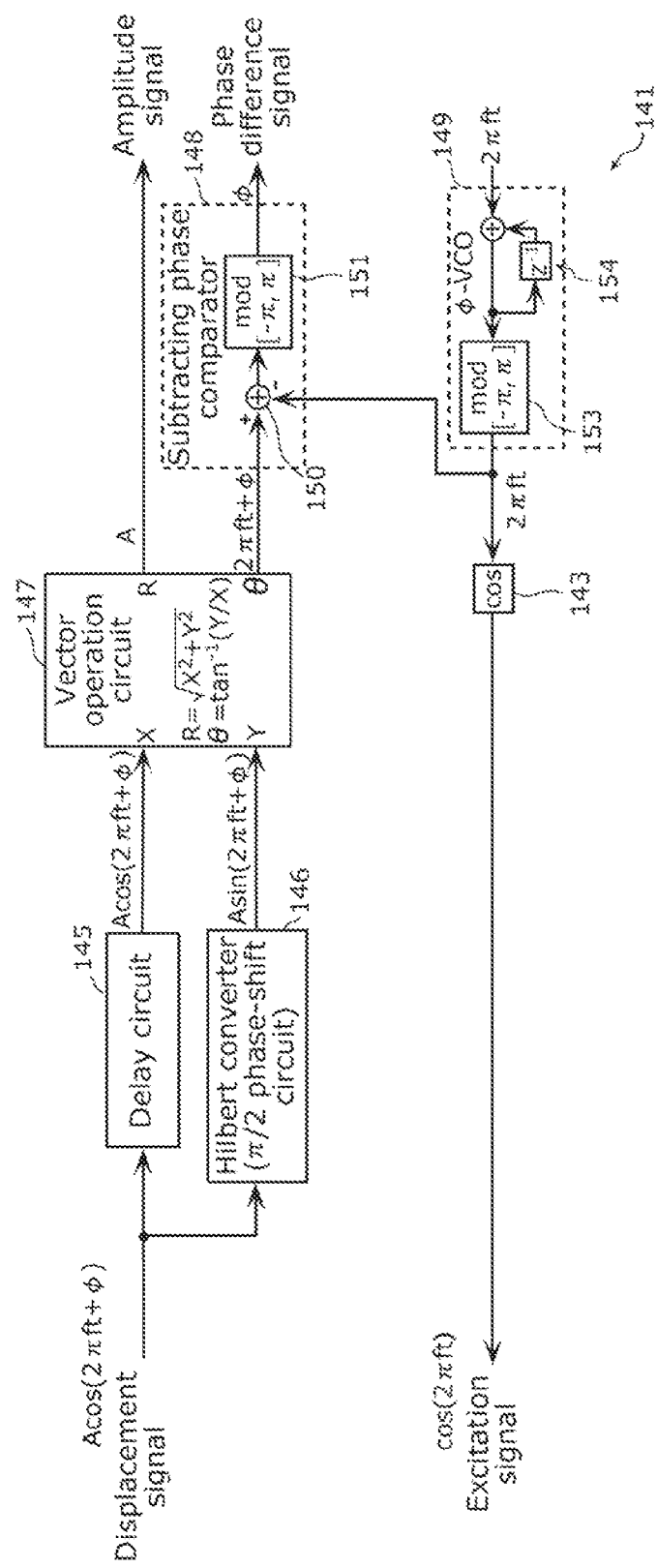
FIG. 4 schematically illustrates a configuration of a signal detection circuit for the AM-AFM and the PM-AFM that includes a conventional subtracting phase comparator.
Figure 5:
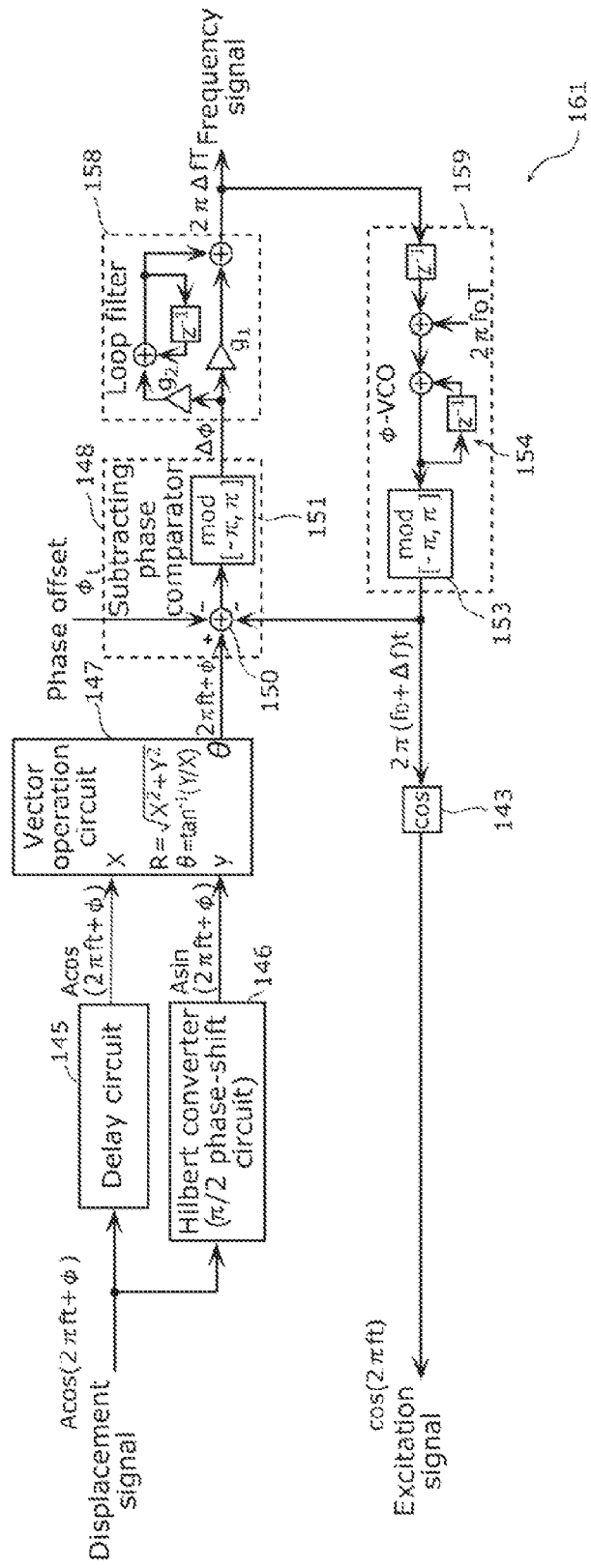
FIG. 5 schematically illustrates a configuration of a signal detection circuit for FM-AFM that includes a conventional subtracting phase comparator.

In response to the problems, the Inventors of the present invention have conceived a signal detection circuit including a subtracting phase comparator. FIG. 4 schematically illustrates a configuration of a signal detection circuit 141 for FM-AFM and PM-AFM that includes a conventional subtracting phase comparator 148, and FIG. 5 schematically illustrates a configuration of a signal detection circuit 161 for FM-AFM including the conventional subtracting phase comparator 148.

The signal detection circuit 141 in FIG. 4 differs from the signal detection circuit 121 including the multiplying phase comparator in inclusion of a delay circuit 145, a π/2 phase-shift circuit 146, a vector operation circuit 147, and a subtracting phase comparator 148 as a replacement for the amplitude/phase detector 125 in the signal detection circuit 121.

Specifically, the signal detection circuit 141 includes a VCO 149 that generates an excitation phase signal indicating a phase of an excitation signal, an excitation signal generating circuit 143 that generates an excitation signal from the excitation phase signal, a complex signal generating circuit that includes the delay circuit 145 and the π/2 phase-shift circuit (for example, Hilbert converter) 146 and that generates a complex signal from a displacement signal, a vector operation circuit 147 that calculates an absolute value and an argument of the complex signal by performing a vector operation, and the subtracting phase comparator 148 that compares the argument with a phase of the excitation phase signal by calculating a difference between the argument and the phase of the excitation phase signal.

The VCO 149 generates an excitation phase signal 2πft that varies at an excitation frequency f. The generated excitation phase signal 2πft indicates a phase of an excitation signal, and is input to the subtracting phase comparator 148. Furthermore, the excitation signal generating circuit 143 converts the excitation phase signal 2πft into an excitation signal cos (2πft), and outputs the excitation signal.

The VCO 149 includes a digital VCO. The signal 2πΔft is input to the VCO 149. t denotes a sampling period. As shown in the circuit in FIG. 4, the digital VCO includes a loop 154 in which the input 2πΔft is accumulated and which grows as corresponding signals are sequentially added together. The signal 2πft is processed by a modulo operation circuit 153. The modulo operation circuit 153 divides an input value by π and outputs the remainder. The modulo operation circuit 153 limits an output range to [−π, π]. As a result, the excitation phase signal 2πft has a waveform in which a linear increase from −π to π is periodically repeated.

A displacement signal A cos (2πft+φ) from the cantilever 103 is input both to the delay circuit 145 and to the π/2 phase-shift circuit (for example, Hilbert converter) 146. The π/2 phase-shift circuit 146 lags the phase of the input signal by 90° to output the resultant signal Y=A sin (2πft+φ). The delay circuit 145 delays the input signal by the same duration as that by the π/2 phase-shift circuit 146 to output a signal X=A cos (2πft+φ). The signals X and Y correspond to complex signals.

The complex signals X and Y are input to the vector operation circuit 147. The vector operation circuit 147 calculates an absolute value R and an argument θ of a complex signal X+jY. The absolute value R is $(X^2+Y^2)^{1/2}$, and the argument θ is $\tan^{-1}(Y/X)$. The absolute value R indicates the amplitude A of the displacement signal, and is output without any change as an amplitude signal.

On the other hand, the argument θ is input to the subtracting phase comparator 148. Furthermore, the subtracting phase comparator 148 receives the excitation phase signal 2πft from the VCO 149. The subtracting phase comparator 148 compares the argument θ with a phase of the excitation phase signal 2πft by calculating a difference between the argument θ and the phase of the excitation phase signal 2πft. Specifically, as shown in FIG. 4, the subtracting phase comparator 148 includes a subtraction circuit 150 and a modulo operation circuit 151. The subtraction circuit 150 calculates the difference between the argument θ and the phase of the excitation phase signal 2πft (φ=θ−2πft). Moreover, the modulo operation circuit 151 processes an output from the subtraction circuit 150. The modulo operation circuit 151 divides an input value by π and outputs the remainder to limit the output range to [−π, π].

As described above, the subtracting phase comparator 148 compares the argument θ with the phase of the excitation phase signal 2πft by calculating the difference between them. The result of the comparison by the subtracting phase comparator 148 corresponds to the phase difference φ between the excitation signal and the displacement signal, and is output as a phase difference signal.

As similarly described above, a signal detection circuit 161 in FIG. 5 differs from the signal detection circuit 131 including the multiplying phase comparator in inclusion of the delay circuit 145, the π/2 phase-shift circuit (for example, Hilbert converter) 146, the vector operation circuit 147, and the subtracting phase comparator 148 as a replacement for the amplitude/phase detector 125 in the signal detection circuit 131.

As shown in FIG. 5, the signal detection circuit 161 schematically includes a VCO 159 that generates an excitation phase signal indicating a phase of an excitation signal, the excitation signal generation circuit 143 that generates an excitation signal from the excitation phase signal, a complex signal generation circuit that includes the delay circuit 145 and the π/2 phase-shift circuit (for example, Hilbert converter) 146 and that that generates a complex signal from a displacement signal, a vector operation circuit 147 that calculates an argument of the complex signal by performing a vector operation, the subtracting phase comparator 148, and the loop filter 158 that controls the VCO 159 based on an output from the subtracting phase comparator 148.

The VCO 159, the subtracting phase comparator 148, and the vector operation circuit 147 are the same as the VCO 149, the subtracting phase comparator 148, and the vector operation circuit 147 in FIG. 4, and thus the detailed description thereof will be omitted.

The vector operation circuit 147 calculates and outputs the argument θ of the complex signal X+jY. The vector operation circuit 147 calculates only the argument θ required for the FM-AFM. The argument θ is $\tan^{-1}(Y/X)$.

The vector operation circuit 147 inputs the argument θ to the subtracting phase comparator 148. The subtracting phase comparator 148 further receives the excitation phase signal 2πft from the VCO 159 and also receives a phase offset φ0. The phase offset φ0 is a target value for the difference in phase between the excitation signal and the displacement signal as described above. The phase offset φ0 is set to 90°

The subtracting phase comparator 148 outputs, to the loop filter 158, a comparator output Δφ indicating a difference between the phase difference φ and the phase offset φ0.

The loop filter 158 transmits an output 2πΔfT to the VCO 159 (T denotes a sampling period for input and output signals). The loop filter 158 adjusts the output 2πΔfT so as to zero the comparator output Δφ. The VCO 159 varies the oscillation frequency f of the excitation signal 2πft as an output, depending on a variation in input 2πΔfT. The oscillation frequency f deviates from the free-running frequency f0 (the oscillation frequency obtained when the input is 0) by Δf.

In the configuration of FIG. 5, the VCO 159, the subtracting phase comparator 148, and the loop filter 158 form a PLL circuit. The value of Δf varies such that the frequency of the displacement signal equals that of the excitation signal, that is, f=f0+Δf. Thus, an output value 2πΔfT from the loop filter 158 is proportional to variation in the frequency of the displacement signal. Thus, this signal is output as the frequency signal.

Furthermore, the difference in phase between the displacement signal and the excitation signal can be adjusted by varying the value of the phase offset φ0. In the FM-AFM, the phase offset φ0 is set to 90°. Thus, the phase difference φ is kept at 90°, and the cantilever 103 is oscillated at the resonant frequency. Even if the resonant frequency of the cantilever 103 varies by the interaction between the cantilever 103 and the sample, the cantilever 103 continues to be oscillated at the resonant frequency. Thus, the frequency signal has a value indicating variation (shift) Δf in the resonant frequency of the cantilever 103. The frequency signal is used for feedback control.

As described above, the loop filter 158 controls the output 2πΔfT so as to zero the comparator output Δφ. To achieve this control, the loop filter 158 generates a value by multiplying the comparator output Δφ by a gain $g_1$ and also generates a value by multiplying the integral value of the comparator output Δφ by a gain $g_2$. Then, an adder adds these values together. The comparator output Δφ indicates the difference between the phase difference φ and the phase offset φ0. The loop filter 158 carries out proportional and integral processes so as to zero the comparator output Δφ. This means that the subtracting phase comparator 148 and the loop filter 158 function as a PI control circuit so as to make the phase difference φ equal to the phase offset φ0. The output 2πΔfT from the loop filter 158 is proportional to variation in the frequency of the displacement signal, thus resulting in obtainment of a frequency signal.

Furthermore, in the signal detection circuits 141 and 161 each including the subtracting phase comparator 148 in FIGS. 4 and 5, for example, the π/2 phase-shift circuit 146, such as a Hilbert converter, performs signal processing of lagging the phase of the input signal by 90°. Here, the π/2 phase-shift circuit 146 has a problem in operating only in response to a signal within a predetermined frequency range. Furthermore, a problem in that a high-order circuit for expanding the frequency range delays an output signal corresponding to the input signal occurs. Furthermore, when the input signal contains high frequency noise, the high frequency noise cannot be removed unlike by the LPF. Thus, there is a problem that the output signal is instable due to the influence of the high frequency noise.

Thus, as described in Embodiments below, a signal detection circuit and an SPM that can obtain a stable output signal at faster speed have been conceived.

Embodiment 1

Embodiment 1 according to the present invention will be described hereinafter.

Figure 6:
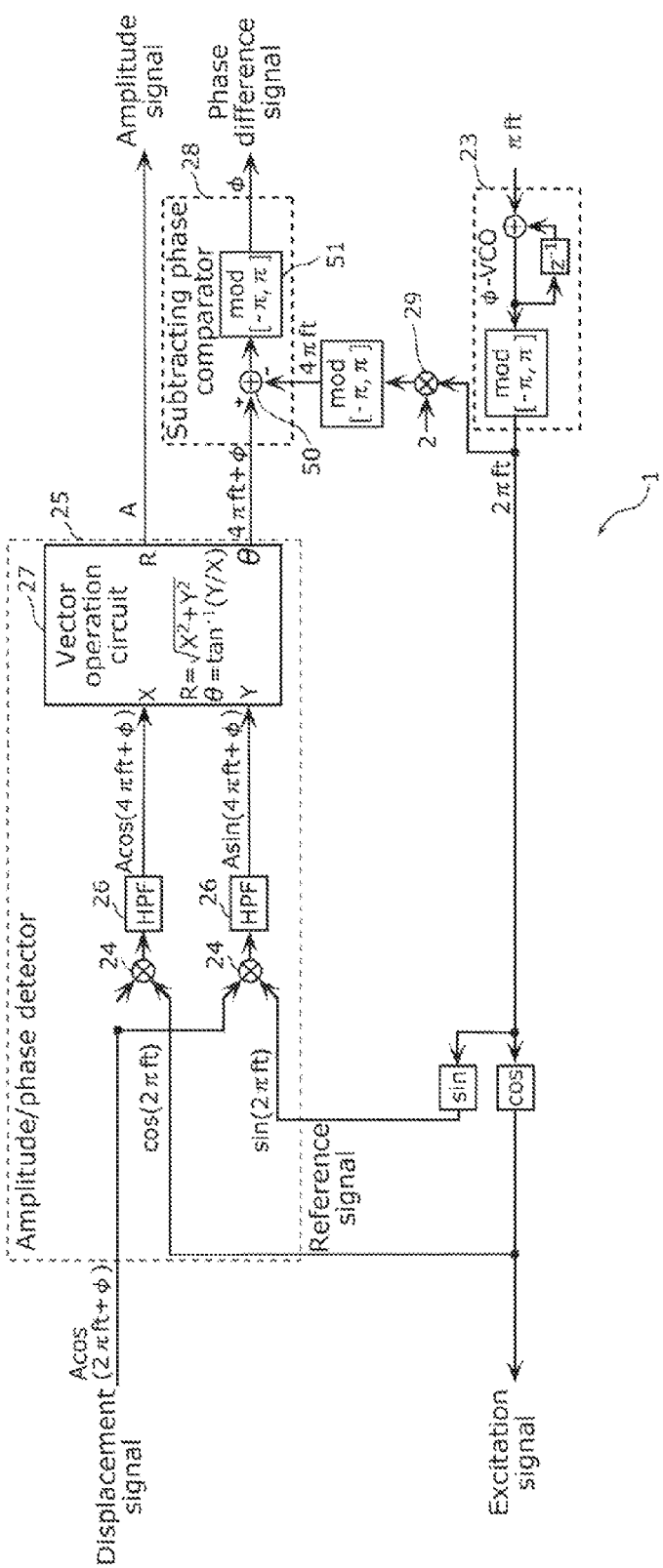
FIG. 6 schematically illustrates a configuration of a signal detection circuit for AM-AFM and PM-AFM according to Embodiment 1.

FIG. 6 schematically illustrates a configuration of a signal detection circuit 1 according to Embodiment 1. As illustrated in FIG. 6, the signal detection circuit 1 includes a VCO 23, an amplitude/phase detector 25, a subtracting phase comparator 28, and a multiplier 29.

The VCO 23 corresponds to a first oscillation circuit according to the present invention. The VCO 23 generates an excitation phase signal 2πft that varies at an excitation frequency f in the same manner as the VCO 123 in FIG. 2. After the signal output from the VCO 23 is converted into cosine waves, the cosine waves are used as an excitation signal for a cantilever 103 and as reference signals of the amplitude/phase detector 25.

The amplitude/phase detector 25 corresponds to a phase detector according to the present invention. The amplitude/phase detector 25 differs from the amplitude/phase detector 125 in FIG. 2 in inclusion of HPFs 26 in the amplitude/phase detector 25 as a replacement for the LPFs 126.

A displacement signal (input signal) A cos (2πft+φ) from the cantilever 103 is input to the amplitude/phase detector 25. Furthermore, a reference signal cos (2πft) and a reference signal sin (2πft) that are converted from the excitation phase signal 2πft and generated by the VCO 23 are input to the amplitude/phase detector 25. These reference signals are converted to X=A cos (4πft+φ) and Y=A sin (4πft+φ) through the multiplication circuits 24 and the HPFs 26. A pair of the multiplication circuit 24 and the HPF 26 corresponds to a complex signal generation circuit according to the present invention.

The multiplication circuits 24 multiply each of the signals X and Y by the input displacement signal (input signal) A cos (2πft+φ). The resulting displacement signals are output to the HPFs 26. The HPFs 26 remove the DC component from the displacement signals to output A cos (4πft+φ) and A sin (4πft+φ) signals to the vector operation circuit 27.

The vector operation circuit 27 calculates an absolute value R and an argument θ of a complex input X+jY. The absolute value R is $(X^2+Y^2)^{1/2}$, and the argument θ is $\tan^{-1}(Y/X)$. The absolute value R corresponds to the amplitude A of the displacement signals. The argument θ corresponds to the phase difference φ between the displacement signal and the excitation signal. The vector operation circuit 27 outputs the absolute value R and the argument θ as the amplitude signal A and the phase difference signal φ, respectively.

The vector operation circuit 27 outputs the argument θ to the subtracting phase comparator 28. The subtracting phase comparator 28 has the same configuration as the subtracting phase comparator 148 in FIG. 4, and includes a subtraction circuit 50 and a modulo operation circuit 51.

The subtracting phase comparator 28 receives the argument θ, and the phase difference signal 4πft obtained by doubling, through the multiplier 29, the frequency of the excitation phase signal 2πft output from the VCO 23. The subtracting phase comparator 28 compares the argument θ with a phase of the phase difference signal 4πft by calculating a difference between them.

Specifically, the subtraction circuit 50 in the subtracting phase comparator 28 determines the difference between the argument θ and the phase of the phase difference signal 4πft (φ=θ−4πft). The modulo operation circuit 51 divides the input value φ by π and outputs the remainder to limit the output range to [−π, π].

As described above, the subtracting phase comparator 28 compares the argument θ with the phase of the excitation phase signal 4πft by calculating a difference between them. The result of the comparison by the subtracting phase comparator 28 corresponds to the phase difference φ between the excitation signal and the displacement signal, and is output as a phase difference signal.

As such, the amplitude signal A and the phase difference signal φ are output from the signal detection circuit 1.

Table 1 indicates the result of comparison in bandwidth of an output signal and delay time of the output signal corresponding to the input signal, between the signal detection circuit 1 for AM-AFM and PM-AFM according to Embodiment 1 in FIG. 6 and the signal detection circuit 121 for AM-AFM and PM-AFM including the conventional multiplying phase comparator illustrated in FIG. 2. The result is the outcome of comparison on the phase difference signals that have been output when the signal detection circuits 1 and 121 were used for PM-AFM.

In the comparison, the signal detection circuits 1 and 121 were implemented on respective field-programmable gate arrays (FPGA), and comparisons on the bandwidth of an output signal and the delay time of the output signal corresponding to the input signal were made. Here, the conversion rate for analog to digital (AD) and digital to analog (DA) in input and output is 100 MSPS, and the operation clock of the FPGA is 100 MHz. The measurements were made at 150 kHz of a resonant frequency for general cantilevers for AFMs for high-resolution imaging in liquids, and also at 3 MHz of the maximum speed of a resonant frequency for smaller cantilevers.

In other words, the signal detection circuit 1 differs from the signal detection circuit 121 in that the signal detection circuit 1 includes the HPFs 26, whereas the signal detection circuit 121 includes the LPFs 126. The attenuation of a signal to be blocked by the respective filters was higher than or equal to 40 dB, and the passband ripple was lower than or equal to 0.1 dB. Furthermore, the cut-off frequency and the order of each of the filters were optimized to minimize the delay of the output signal with respect to the frequency of the input signal of the filter.

TABLE 1

| Frequency of input signal | Conventional signal detection circuit 121 | | Signal detection circuit 1 according to Embodiment 1 | |
|---|---|---|---|---|
| | Bandwidth | Delay time | Bandwidth | Delay time |
| 150 kHz | 90.58 kHz | 9.14 μs | 139 kHz | 1.07 μs |
| 3 MHz | 1.78 MHz | 1.49 μs | 2.84 MHz | 0.88 μs |

As indicated in Table 1, when the frequency of the input signal was 150 kHz, the bandwidth of the output signal in the conventional signal detection circuit 121 was 90.58 kHz, and the same in the signal detection circuit 1 according to Embodiment 1 was 139 kHz, showing that the bandwidth of the signal detection circuit 1 is wider. Furthermore, the delay time of the output signal corresponding to the input signal in the conventional signal detection circuit 121 was 9.14 μs, and the same in the signal detection circuit 1 according to Embodiment 1 was 1.07 μs, showing that the delay time of the signal detection circuit 1 is shorter.

Furthermore, when the frequency of the input signal was 3 MHz, the bandwidth of the output signal in the conventional signal detection circuit 121 was 1.78 MHz, and the same in the signal detection circuit 1 according to Embodiment 1 was 2.84 MHz, showing that the bandwidth of the signal detection circuit 1 is wider. Furthermore, the delay time of the output signal corresponding to the input signal in the conventional signal detection circuit 121 was 1.49 μs, and the same in the signal detection circuit 1 according to Embodiment 1 was 0.88 μs, showing that the delay time of the signal detection circuit 1 is shorter.

The signal detection circuit 1 according to Embodiment 1 that detects modulation of an amplitude or a phase of an oscillation can obtain a stable output signal at faster speed.

Furthermore, the signal detection circuit 1 can generate second harmonic and perform complex signaling for analyzing signals simultaneously by multiplying an input signal by a sine function and a cosine function that are at the same frequency as that of the input signal and removing the DC component through HPFs.

Furthermore, a phase can be detected at faster speed by comparing a phase calculated by performing a vector operation with a phase of the excitation signal (reference signal) by calculating a difference between the phases.

Furthermore, the signal detection circuit 1 may be used as the signal detection circuit 111 of the SPM in FIG. 1. Specifically, the SPM includes: the signal detection circuit 1; the cantilever 103 that detects information on a surface of a sample; the exciter 109 that excites the cantilever 103; the sensor 113 that detects a displacement signal of the cantilever 103; and the feedback circuit 115 that performs feedback control for maintaining a constant interaction between the cantilever 103 and the sample, wherein the signal detection circuit 1: determines the displacement signal detected by the sensor 113 as the input displacement signal; and generates an excitation signal for exciting the cantilever 103, based on the reference signal, and outputs the excitation signal to the exciter 109, and the feedback circuit 115 performs the feedback control based on an output signal from the signal detection circuit 1. Accordingly, the SPM can detect a stable signal at faster speed.

Embodiment 2

Embodiment 2 according to the present invention will be described hereinafter.

Figure 7:
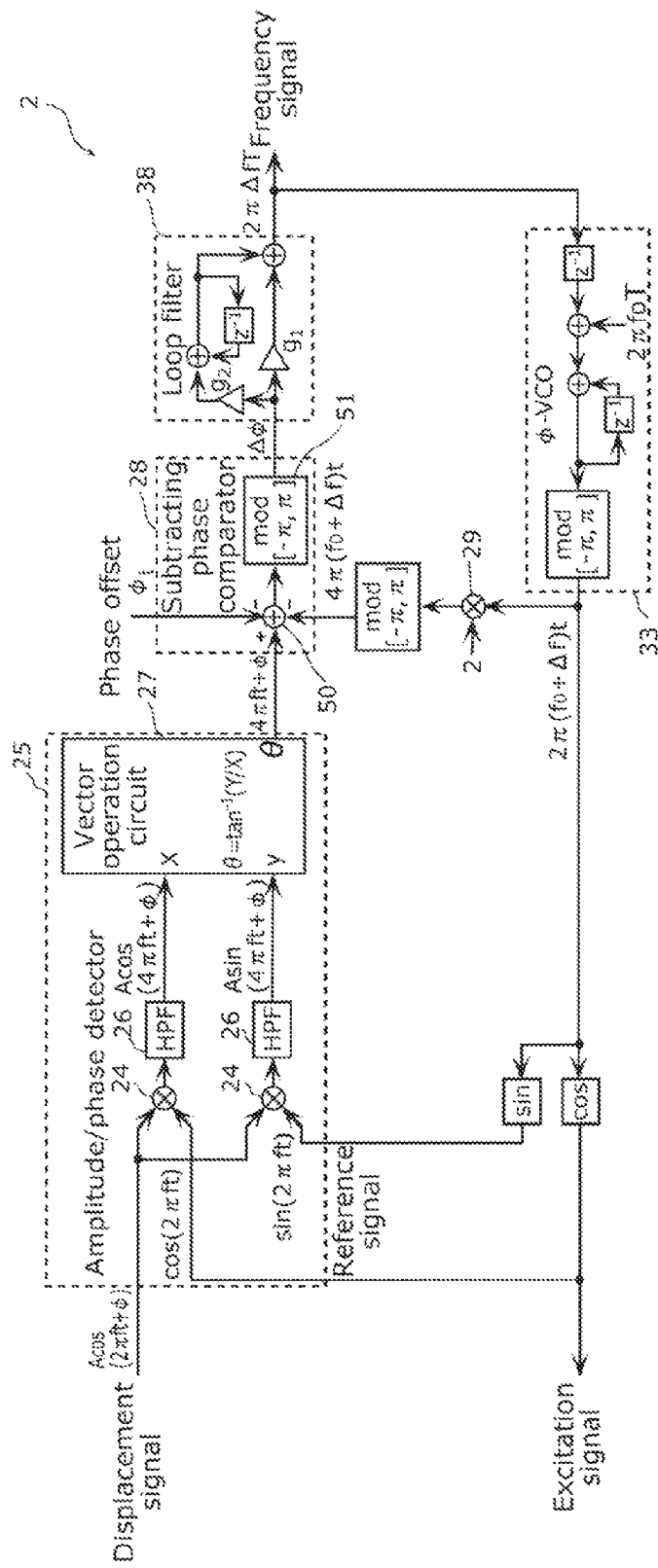
FIG. 7 schematically illustrates a configuration of a signal detection circuit according to Embodiment 2.

FIG. 7 schematically illustrates a configuration of a signal detection circuit 2 according to Embodiment 2. As illustrated in FIG. 7, the signal detection circuit 2 includes a VCO 33, an amplitude/phase detector 25, a subtracting phase comparator 28, a multiplier 29, and a loop filter 38 that is a PI control circuit.

The VCO 33 corresponds to a first oscillation circuit according to the present invention. The VCO 33 generates an excitation phase signal $2\pi ft$ that varies at an excitation frequency f in the same manner as the VCO 133 in FIG. 3. Note that the frequency f deviates from the free-running frequency f0 (an oscillation frequency obtained when the input is 0) of the VCO 33 by $\Delta f$ in FIG. 7. After the excitation phase signal $2\pi ft$ output from the VCO 33 is converted into cosine waves, the cosine waves are used as an excitation signal for a cantilever 103 and as reference signals of the amplitude/phase detector 25.

The amplitude/phase detector 25 corresponds to a phase detector according to the present invention. The amplitude/phase detector 25 differs from the amplitude/phase detector 125 in FIG. 3 in inclusion of HPFs 26 in the amplitude/phase detector 25 as a replacement for the LPFs 126.

A displacement signal (input signal) $A \cos(2\pi ft+\phi)$ of the cantilever 103 is input to the amplitude/phase detector 25. Furthermore, a reference signal $\cos(2\pi ft)$ and a reference signal $\sin(2\pi ft)$ that are converted from the excitation phase signal $2\pi ft$ and generated by the VCO 33 are input to the amplitude/phase detector 25. These reference signals are converted to $X=A \cos(4\pi ft+\phi)$ and $Y=A \sin(4\pi ft+\phi)$ through the multiplication circuits 24 and the HPFs 26.

The multiplication circuits 24 multiply each of the signals X and Y by the input displacement signal (input signal) $A \cos(2\pi ft+\phi)$. The resulting displacement signals are output to the HPFs 26. The HPFs 26 remove the DC component from the displacement signals to output $A \cos(4\pi ft+\phi)$ and $A \sin(4\pi ft+\phi)$ signals to the vector operation circuit 27.

The vector operation circuit 27 calculates an argument $\theta$ of a complex input $X+jY$. The argument $\theta$ is $\tan^{-1}(Y/X)$. The argument $\theta$ corresponds to the phase difference $\phi$ between the displacement signal and the excitation signal. The vector operation circuit 27 outputs the argument $\theta$ as the phase difference signal $\phi$.

The vector operation circuit 27 outputs the argument $\theta$ to the subtracting phase comparator 28. The subtracting phase comparator 28 has the same configuration as the subtracting phase comparator 148 in FIG. 5, and includes a subtraction circuit 50 and a modulo operation circuit 51.

The subtracting phase comparator 28 receives the argument $\theta$, and the phase difference signal $4\pi ft$ obtained by doubling, through the multiplier 29, the frequency of the excitation phase signal $2\pi ft$ output from the VCO 33. The subtracting phase comparator 28 compares the argument $\theta$ with a phase of the phase difference signal $4\pi ft$ by calculating a difference between them.

Specifically, the subtraction circuit 50 in the subtracting phase comparator 28 determines the difference between the argument $\theta$ and the phase of the phase difference signal $4\pi ft$ ($\phi=\theta-4\pi ft$). Note that the frequency f deviates from the free-running frequency f0 (an oscillation frequency obtained when the input is 0) of the VCO 33 by $\Delta f$ in FIG. 7 ($4\pi ft=4\pi(f0+\Delta f)t$). The modulo operation circuit 51 divides the input value $\phi$ by $\pi$ and outputs the remainder to limit the output range to $[-\pi, \pi]$.

As described above, the subtracting phase comparator 28 compares the argument $\theta$ with the phase of the excitation phase difference signal $4\pi ft$ by calculating a difference between them. The result of the comparison by the subtracting phase comparator 28 corresponds to the phase difference $\Delta\phi$ between the excitation signal and the displacement signal, and is output as a phase difference signal.

The phase difference $\Delta\phi$ generated by the amplitude/phase detector 25 is input to the loop filter 38. The loop filter 38 controls an output $2\pi\Delta fT$ (T denotes a sampling period for input and output signals) such that the input phase difference $\Delta\phi$ equals a target value $\phi 0$. The output $2\pi\Delta fT$ is input to the VCO 33 to change the frequency f of the output signal (excitation phase signal) $2\pi ft$ of the VCO 33. The frequency f deviates from the free-running frequency f0 (an oscillation frequency obtained when the input is 0) of the VCO 33 by $\Delta f$ ($2\pi ft=2\pi(f0+\Delta f)t$).

In the configuration of FIG. 7, the VCO 33, the amplitude/phase detector 25, and the loop filter 38 form a PLL circuit. The loop filter 38 functions as a loop filter for the PLL circuit. The PLL circuit varies the value of the frequency f of the excitation signal so that the frequency of the displacement signal equals that of the excitation signal, that is, $f=f0+\Delta f$. Thus, an output value of the loop filter 38 is proportional to variation in the frequency of the displacement signal. Thus, the output value of the loop filter 38 is output as a frequency signal.

Furthermore, the loop filter 38 can adjust a difference in phase between the displacement signal and the excitation signal by varying the target value $\phi 0$. In the FM-AFM, the target phase difference is set to 90°. Thus, the phase difference $\Delta\phi$ is kept at 90°, and the cantilever 103 is oscillated at the resonant frequency. Even if the resonant frequency of the cantilever 103 varies by the interaction between the cantilever 103 and the sample, the cantilever 103 continues to be oscillated at the resonant frequency. The frequency signal has a value indicating variation (shift) $\Delta f$ in the resonant frequency of the cantilever 103. The frequency signal is used for feedback control.

The signal detection circuit 2 according to Embodiment 2 that detects modulation of a frequency can obtain a stable output signal at faster speed.

Furthermore, the signal detection circuit 2 may be used as the signal detection circuit 111 of the SPM in FIG. 1. Specifically, the SPM includes: the signal detection circuit 2; the cantilever 103 that detects information on a surface of a sample; the exciter 109 that excites the cantilever 103; the sensor 113 that detects a displacement signal of the cantilever 103; and the feedback circuit 115 that performs feedback control for maintaining a constant interaction between the cantilever 103 and the sample, wherein the signal detection circuit 2: determines the displacement signal detected by the sensor 113 as the input signal; and generates an excitation signal for exciting the cantilever 103, based on the reference signal, and outputs the excitation signal to the exciter 109, and the feedback circuit 115 performs the feedback control based on an output signal from the signal detection circuit 2. Accordingly, the SPM can detect a stable signal at faster speed.

(Variations)

Figure 8:
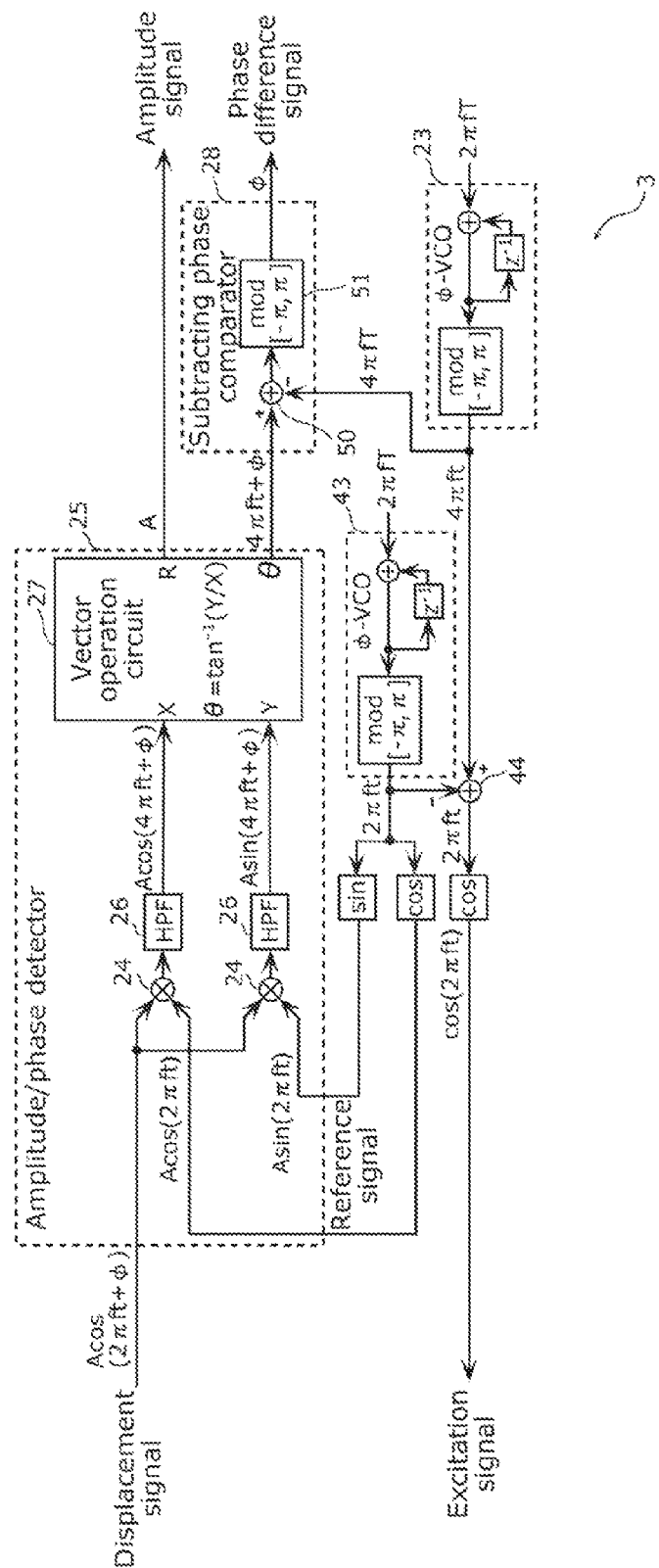
FIG. 8 schematically illustrates an example configuration of a signal detection circuit according to Variations.
Figure 9:
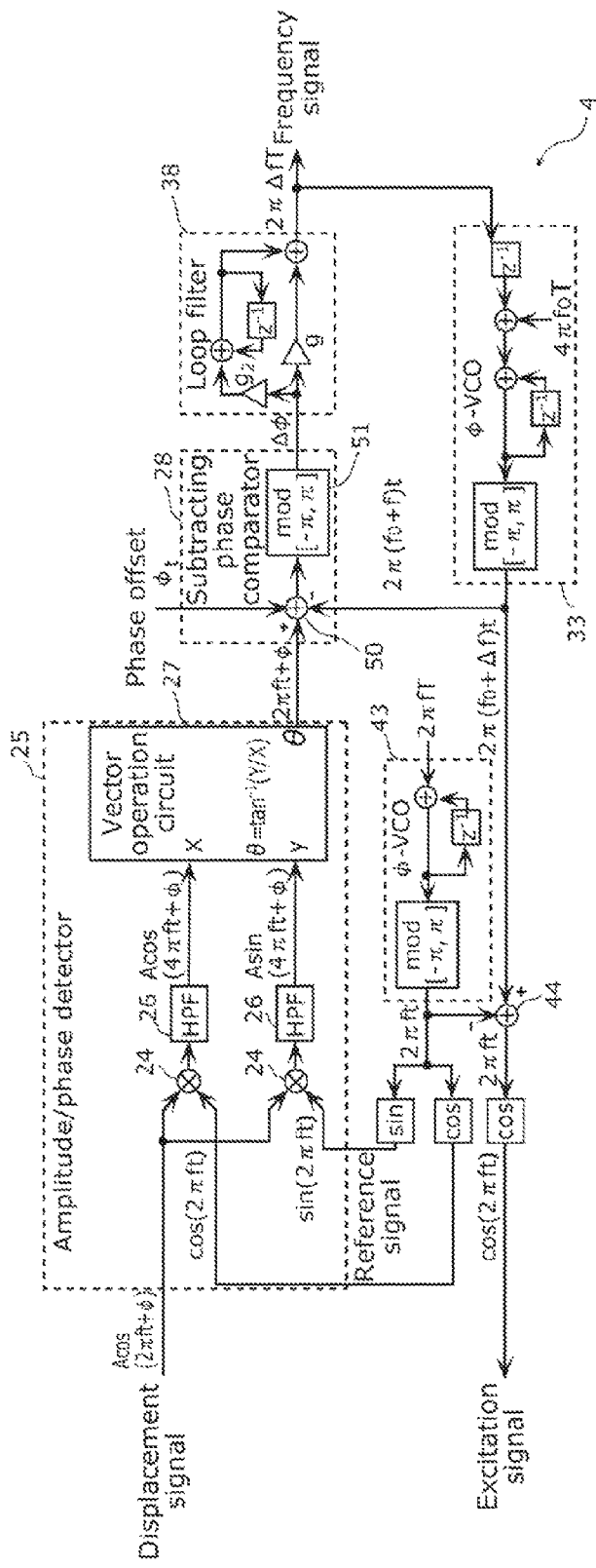
FIG. 9 schematically illustrates another example configuration of a signal detection circuit according to Variations.

Variations of Embodiments 1 and 2 will be described hereinafter. FIG. 8 schematically illustrates an example configuration of a signal detection circuit 3 according to Variations, and FIG. 9 schematically illustrates another example configuration of a signal detection circuit 4 according to Variations.

Specifically, the signal detection circuit 3 according to Variations differs from the signal detection circuit 1 according to Embodiment 1 in inclusion of a VCO 43 and a subtractor 44 as a replacement for the multiplier 29 as illustrated in FIG. 8. The VCO 43 corresponds to a second oscillation circuit according to the present invention.

The VCO 23 generates an excitation phase signal $4\pi fT$ that varies at an excitation frequency f. Furthermore, the VCO 43 generates a local oscillation phase signal $2\pi ft$ that varies at the excitation frequency f. The excitation phase signal $4\pi fT$ generated by the VCO 23 is input to the subtracting phase comparator 28. The subtracting phase comparator 28 compares the argument θ with a phase of the excitation phase signal $4\pi fT$ by calculating a difference between them. The result of the comparison by the subtracting phase comparator 28 corresponds to the phase difference φ between the excitation signal and the displacement signal, and is output as a phase difference signal.

Furthermore, the local oscillation phase signal $2\pi ft$ generated by the VCO 43 is input to the subtractor 44. Accordingly, the subtractor 44 performs the frequency conversion on the local oscillation phase signal $2\pi ft$ and the excitation phase signal $4\pi ft$ by calculating a difference between them. As a result of the conversion, the signal detection circuit 3 outputs cosine waves as an excitation signal.

Since the signal detection circuit 3 according to Variations requires less number of the constituent elements arranged after the amplitude/phase detector 25, the implementations can be more flexible.

Similarly, the signal detection circuit 4 according to Variations differs from the signal detection circuit 2 according to Embodiment 2 in inclusion of a VCO 43 and a subtractor 44 as a replacement for the multiplier 29, as illustrated in FIG. 9. Accordingly, the subtractor 44 performs the frequency conversion on the local oscillation phase signal $2\pi ft$ and the excitation phase signal $4\pi ft$ by calculating a difference between them. As a result of the conversion, the signal detection circuit 4 outputs cosine waves as an excitation signal. Since the signal detection circuit 4 according to Variations is a signal detection circuit for FM-AFM, the frequency of the local oscillation phase signal $2\pi ft$ generated by the VCO 43 may have an error. However, the frequency of the local oscillation phase signal $2\pi ft$ is almost the same as that of the displacement signal.

The signal detection circuit 4 according to Variations does not include the multiplier 29 in the PLL circuit. Thus, when the signal detection circuit 4 is implemented on a digital signal processor, the timing constraint can be easily satisfied.

The present invention, not limited to Embodiments and Variations, may be modified or improved without departing from the scope of the present invention.

For example, although the signal detection circuit for AM-AFM and PM-AFM and the signal detection circuit for FM-AFM are separately constructed in Embodiments and Variations, a signal detection circuit for AM-AFM, PM-AFM, and FM-AFM may be singly formed. Here, switches may be used for forming the necessary circuits in the signal detection circuit.

Furthermore, the signal detection circuit according to Embodiments may be used in a probe microscope or singly used as a signal detection circuit. Furthermore, the signal detection circuit may be used in combination with, for example, another apparatus.

Furthermore, the present invention includes another embodiment obtained through arbitrary combinations of the constituent elements in Embodiments, another variation with some modifications on Embodiments that are conceived by a person skilled in the art without departing from the scope of the present invention, and various devices including the signal detection circuit according to the present invention, such as a probe microscope, a communication device, and a controller.

INDUSTRIAL APPLICABILITY

The signal detection circuit according to the present invention is effective as a signal detection circuit in devices that require a more stable output signal at faster speed, such as probe microscopes, communication devices, and controllers.

REFERENCE SIGNS LIST 1, 2, 3, 4, 111, 121, 131, 141, 161 Signal detection circuit
23, 33, 123, 133, 149, 159 VCO (first oscillation circuit)
24, 124 Multiplication circuit
25, 125 Amplitude/phase detector
26 High-pass filter (HPF)
27, 127 Vector operation circuit
28, 148 Subtracting phase comparator
29 Multiplier
38, 158 Loop filter
43 VCO (Second oscillation circuit)
101 Scanning probe microscope (SPM)
103 Cantilever (probe)
109 Exciter
113 Sensor
115 Feedback circuit

The invention claimed is:

1. A signal detection circuit that detects at least one of an amplitude, a phase, and a frequency signal based on an input signal and a reference signal, the signal detection circuit comprising:
 a first oscillation circuit that generates the reference signal;
 a complex signal generation circuit that generates a complex signal from the input signal and the reference signal;
 a vector operation circuit that calculates an argument of the complex signal by performing a vector operation; and
 a subtracting phase comparator that compares the argument with a phase of the reference signal by calculating a difference between the argument and the phase of the reference signal,
 wherein the complex signal generation circuit includes:
 a multiplication circuit that multiplies the input signal by the reference signal; and
 a high-pass filter that removes a DC component from a signal output from the multiplication circuit.

2. The signal detection circuit according to claim 1, wherein the subtracting phase comparator outputs at least a phase difference signal.

3. The signal detection circuit according to claim 1, further comprising
 a loop filter that forms a phase locked loop circuit with the first oscillation circuit and the subtracting phase comparator,
 wherein the phase locked loop circuit controls the first oscillation circuit so that the difference between the argument and the phase of the reference signal equals a predetermined phase offset, and generates a frequency signal corresponding to variation in frequency of the input signal through a phase locked loop, and the signal detection circuit outputs the frequency signal.

4. The signal detection circuit according to claim 1, wherein the vector operation circuit calculates an absolute value of the complex signal as an amplitude signal of the input signal, and the signal detection circuit outputs the amplitude signal.

5. The signal detection circuit according to claim 1, comprising a multiplier that matches a frequency of the reference signal generated by the first oscillation circuit with a frequency of the argument output from the vector operation circuit.

6. The signal detection circuit according to claim 5, comprising a second oscillation circuit different from the first oscillation circuit, wherein the first oscillation circuit outputs, to the subtracting phase comparator, a reference signal having a frequency identical to a frequency of the argument output from the vector operation circuit, and the second oscillation circuit outputs, to the multiplier, a reference signal having a frequency almost identical to a frequency of the input signal.

7. A scanning probe microscope, comprising:

the signal detection circuit according to claim 1;

a probe that detects information on a surface of a sample;

an exciter that excites the probe;

a sensor that detects a displacement signal of the probe; and a feedback circuit that performs feedback control for maintaining a constant interaction between the probe and the sample, wherein the signal detection circuit:

determines the displacement signal detected by the sensor as the input signal; and generates an excitation signal for exciting the probe, based on the reference signal, and outputs the excitation signal to the exciter, and the feedback circuit performs the feedback control based on an output signal from the signal detection circuit.

8. A scanning probe microscope, comprising:

the signal detection circuit according to claim 6;

a probe that detects information on a surface of a sample;

an exciter that excites the probe;

a sensor that detects a displacement signal of the probe; and a feedback circuit that performs feedback control for maintaining a constant interaction between the probe and the sample, wherein the signal detection circuit:

determines the displacement signal detected by the sensor as the input signal; and generates an excitation signal for exciting the probe, based on the reference signal, and outputs the excitation signal to the exciter, and the feedback circuit performs the feedback control based on an output signal from the signal detection circuit.

\* \* \* \* \*